(12) United States Patent
Baselmans

(10) Patent No.: US 9,261,402 B2
(45) Date of Patent: Feb. 16, 2016

(54) LITHOGRAPHIC METHOD AND APPARATUS

(71) Applicant: ASML Netherlands B.V., Veldhoven (NL)

(72) Inventor: Johannes Jacobus Matheus Baselmans, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 331 days.

(21) Appl. No.: 13/849,333

(22) Filed: Mar. 22, 2013

(65) Prior Publication Data

US 2013/0271636 A1   Oct. 17, 2013

Related U.S. Application Data

(60) Provisional application No. 61/624,618, filed on Apr. 16, 2012.

(51) Int. Cl.
*G03B 27/54* (2006.01)
*G01J 1/42* (2006.01)
*G03F 7/20* (2006.01)

(52) U.S. Cl.
CPC ............... *G01J 1/42* (2013.01); *G03F 7/7085* (2013.01); *G03F 7/70591* (2013.01); *G03F 7/70941* (2013.01)

(58) Field of Classification Search
CPC ............. G03F 7/70133; G03F 7/7055; G03F 7/70591; G03F 7/7085; G03F 7/70941
USPC ............. 355/52, 53, 55, 67–71; 356/399–401
See application file for complete search history.

(56) References Cited

U.S. PATENT DOCUMENTS

| | | | |
|---|---|---|---|
| 7,224,430 B2 | 5/2007 | Dierichs | |
| 7,315,353 B2 | 1/2008 | Van De Kerkhof et al. | |
| 7,436,502 B2 | 10/2008 | Baselmans et al. | |
| 7,681,172 B2 | 3/2010 | Zhang et al. | |
| 2006/0203221 A1* | 9/2006 | Van De Kerkhof et al. | .... 355/71 |
| 2006/0219947 A1 | 10/2006 | Van De Kerkhof et al. | |
| 2007/0070329 A1* | 3/2007 | Baselmans et al. | ........... 356/121 |
| 2008/0309898 A1 | 12/2008 | Baselmans | |
| 2009/0231568 A1 | 9/2009 | Fukuhara | |

OTHER PUBLICATIONS

Strojnik, M., et al., "Lateral Shear Interferometers," Optical Shop Testing, Chapter 4 Third Edition, 2007; pp. 122-184.

* cited by examiner

*Primary Examiner* — Hung Henry Nguyen
(74) *Attorney, Agent, or Firm* — Sterne, Kessler, Goldstein & Fox P.L.L.C.

(57) ABSTRACT

A method and apparatus are provided for determining apodization properties of a projection system in a lithographic apparatus. The method comprises allowing light from a given point in an illumination field to pass through the projection system along at least three different optical paths, and then determining the difference in the intensity of light received in a projection field from the two different optical paths, and calculating apodization properties of the projection system from the intensity difference. It is not necessary to know the intensity distribution in the illumination field. To provide the different optical paths a pinhole reticle provided with wedges of different orientations is used.

22 Claims, 4 Drawing Sheets

Figure 1:
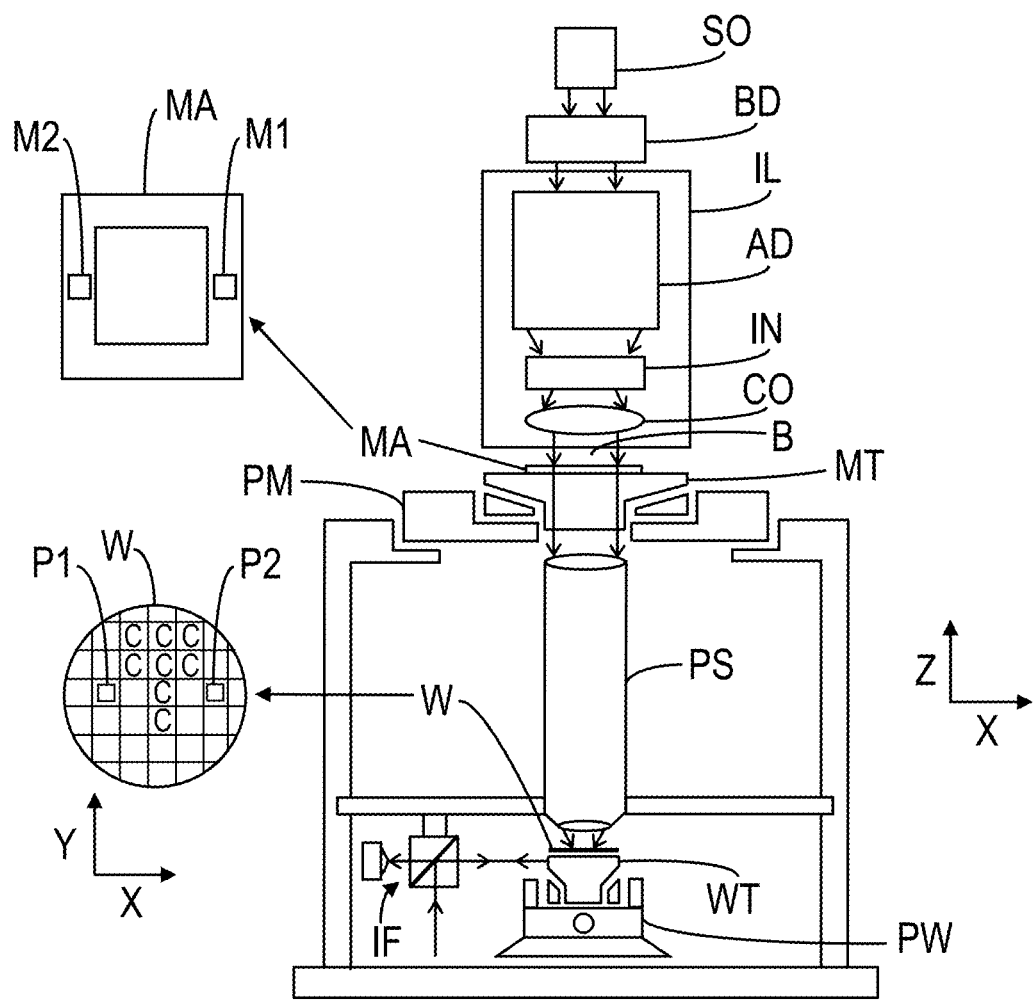

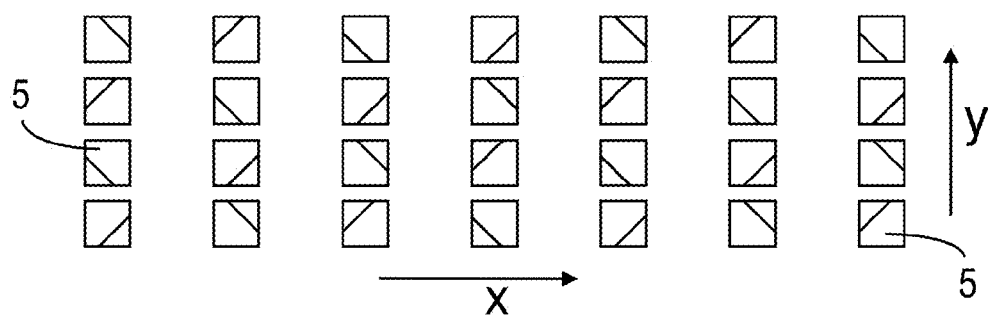
*Fig. 3*
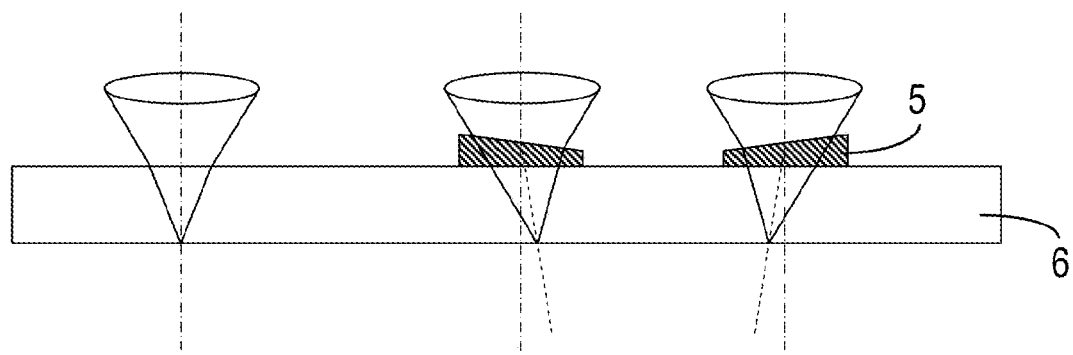
Fig. 4(a) Fig. 4(b) Fig. 4(c)

LITHOGRAPHIC METHOD AND APPARATUS

BACKGROUND

1. Field of the Present Invention

The present invention relates to a lithographic method and apparatus, and in particular to The method and apparatus for determining optical properties of a part of a lithographic apparatus.

2. Background Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

The lithographic apparatus comprises an optical system that includes an illumination system and a projection system. It is known that the projection system will have apodization properties. Apodization refers to a change in the intensity profile of an optical system. In some cases apodization may be introduced deliberately to achieve a desired outcome, in other cases it may be an inherent property of an optical system. In some designs of lithographic apparatus the apodization properties of the projection system are important and it is desirable to know what they are. Measuring or otherwise determining these properties is not straightforward and conventionally requires knowledge of the light distribution in the illumination field before the projection system. This can be difficult to determine and presents an obstacle to knowing the apodization characteristics of the projection system.

SUMMARY

It would therefore be desirable to provide The method of determining the apodization properties of the projection system without requiring knowledge of the light distribution in the illumination field.

According to a first aspect of the present invention, there is provided The method of determining apodization properties of an optical system comprising an illumination system and a projection system, the method comprising allowing light from a given point in an illumination field to pass through the projection system along at least a first optical path, a second optical path and a third optical path, determining a first difference in intensity of light received in a projection field from the first optical path and the second optical path, determining a second difference in intensity of light received in the projection field from the first optical path and the third optical path, and calculating apodization properties of the projection system from the first difference in intensity of light and the second difference in intensity of light.

In some embodiments of the present invention light is allowed to pass through the projection system from a plurality of points disposed in a first direction perpendicular to the optical axis of the system.

In one example, the at least first optical path, second optical path and third optical path are created by interposing optical elements between the illumination system and the projection system. These optical elements may comprise optical wedges with different orientations or may comprise blazed gratings.

In a particularly embodiments of the present invention the method comprises interposing between the illumination system and the projection system a reticle comprising an array of pinholes at least some of the pinholes being covered by an optical wedge and forming a wedge/pinhole pair, and successively illuminating the pinholes. In one example, the array comprises a first number of pairs in a first direction and a second number of pairs in a second direction, wherein in a row of pairs in the second direction the orientation of the wedge differs in each pair. In one example, in the array a row of pairs in the second direction comprises four pinhole/wedge pairs. In one example, in a row of pairs in the second direction the wedges are orientated at 90° intervals relative to each other.

According to another aspect of the present invention there is provided an apparatus for determining apodization properties of an optical system comprising an illumination system and a projection system, the apparatus comprising: means for generating a beam of radiation to pass through the optical system, means for allowing light from a given point in an illumination field to pass through the projection system along at least a first optical path, a second optical path and a third optical path, sensing means for sensing light received in a projection field, means for determining a first difference in intensity of light received in a projection field from the first optical path and the second optical path, means for determining a second difference in intensity of light received in the projection field from the first optical path and the third optical path, and means for calculating apodization properties of the projection system from the first difference in intensity of light and the second difference in intensity of light.

In one example, the means for allowing light to pass along the at least first optical path, second optical path and third optical path comprises an optical element provided between the illumination system and the projection system. Such an optical element may comprise a number of optical wedges or may comprise blazed gratings.

In a particularly embodiment the optical element comprises a reticle provided between the illumination system and the projection system, the reticle comprising an array of pinholes with at least some of the pinholes having an associated optical wedge forming a pinhole/wedge pair. In one example, the array comprises a first number of the pairs in a first direction and a second number of pairs in a second direction, wherein in a row of pairs in the second direction the orientation of the wedge differs in each pair. In one example, in the array a row of pairs in the second direction comprises four pinhole/wedge pairs. In one example, in a row of pairs in the second direction the wedges are orientated at 90° intervals relative to each other.

In one example, the sensing means comprises a sensing module including a camera. The camera may for example be a far field camera.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

FIG. 1 depicts a lithographic apparatus according to an embodiment of the present invention.

Figure 2:
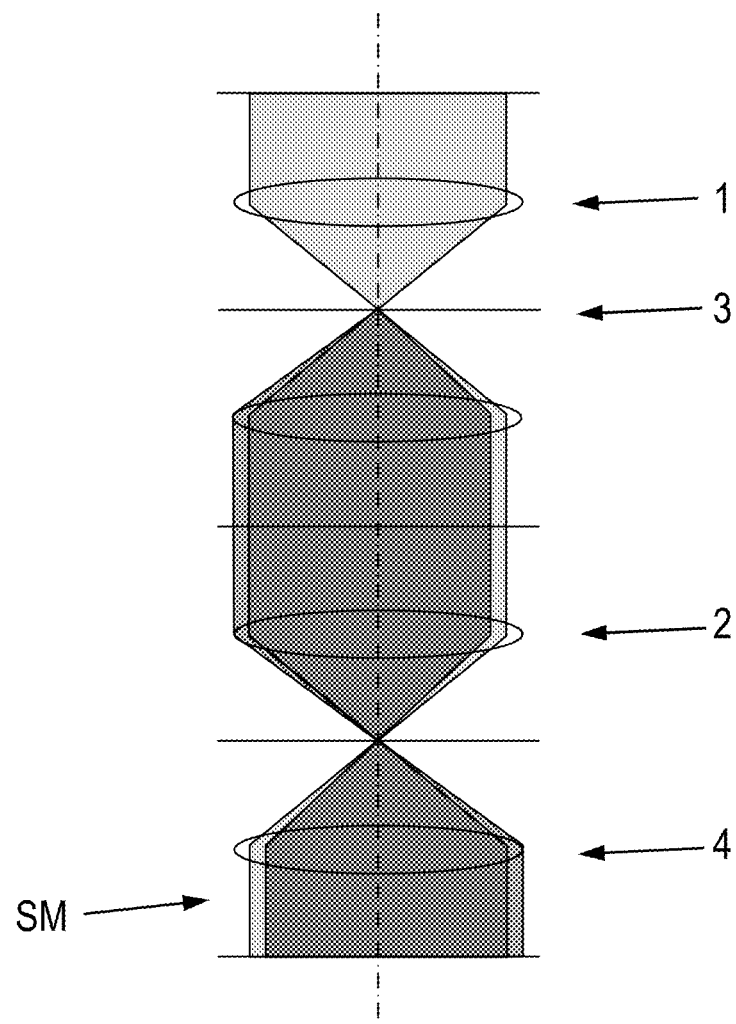

FIG. 2 schematically depicts the optics of the lithographic apparatus.

FIG. 3 schematically depicts a top view of a pinhole reticle for use in an embodiment of the present invention.

FIGS. 4(a)-4(c) illustrate the effect of an optical wedge on the direction of a light cone.

Figure 5:
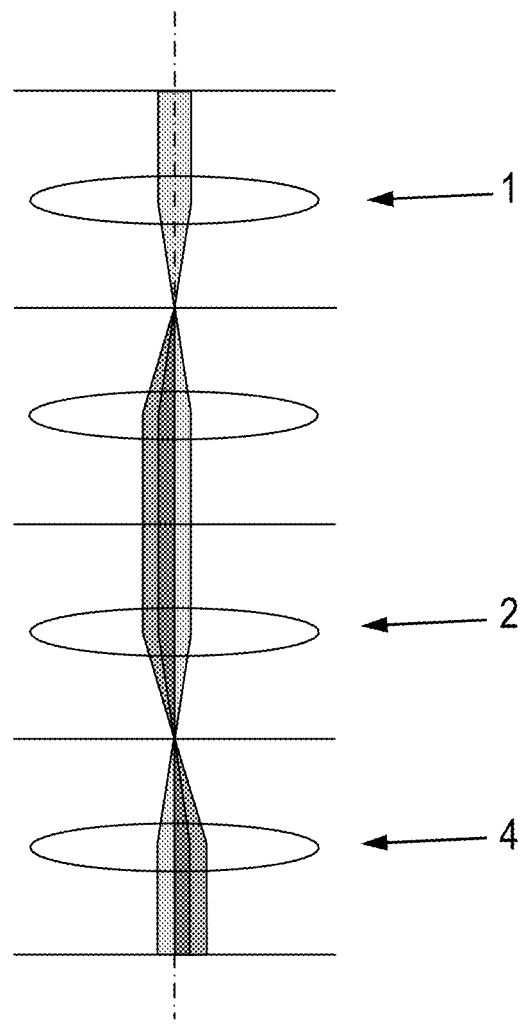

FIG. 5 illustrates the shift of the light paths through the optical system as a consequence of the use of optical wedges in accordance with an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion techniques are well known in the art for increasing the numerical aperture of projection systems.

FIG. 1 schematically illustrates a lithographic apparatus according to an embodiment of the present invention. The apparatus includes an illumination system IL adapted to condition a beam B of radiation (e.g., UV radiation) and a support structure such as a mask table MT configured to hold a patterning device such as a mask MA and connected to a first positioning device PM configured to accurately position the patterning device with respect to a projection system PS. The projection system PS is adapted to image a pattern imparted to the beam B by the patterning device MA onto a target portion C of a substrate W. The apparatus also includes a substrate table such as a wafer table WT configured to hold the substrate W such as a resist coated wafer and connected to a second positioning device PW configured to accurately position the substrate with respect to the projection system PS.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps. Some gas may be provided in some parts of the lithographic apparatus, for example to allow gas flow to be used to reduce the likelihood of contamination reaching optical components of the lithographic apparatus.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

As depicted in FIG. 1 the apparatus is of a transmissive type employing a transmissive mask MA. Alternatively the apparatus could be of a reflective type employing a programmable mirror array.

The illuminator IL receives a beam of radiation from a radiation source SO. The illuminator IL comprises an adjustment device AD configured to set an outer and/or inner radial extent, an integrator IN and a condenser CO. The source SO will include at least two lasers, eg two UV excimer lasers. For convenience of illustration in FIG. 1 a single source SO is shown and the source SO may comprise both lasers or alternatively multiple sources SO may be provided each with a single laser the beams of which are combined before or after entering the projection system PS. A range of alternative optical configurations are possible but what is important to note is that the apparatus includes at least two lasers that are configured to provide radiation to the target. Also provided is a beam delivery system BD including for example suitable directing mirrors and/or a beam expander. The sources SO and the beam delivery system BD combine to form a radiation system that presents a suitable beam of radiation to the projection system. It will be understood that this beam of radiation B comprises radiation from at least two lasers. It will also be understood that the beam may comprises alternating pulses of radiation from the at least two lasers.

The projection system PS may include a diaphragm with an adjustable clear aperture used to set the numerical aperture of the projection system PS at wafer level at a selected value.

The beam of radiation B is incident on the patterning device MA which is held on the support structure MT. Having traversed the patterning device, the beam of radiation B passes through the projection system PS which focuses the beam onto a target portion C of the substrate W. With the aid of a second positioning device PW and position sensor IF (eg an interferometric device) the substrate table WT can be moved accurately so as to position different target portions C in the path of the beam B. Similarly, the first positioning device PM and another position sensors together with alignments marks M1, M2 and P1 and P2 can be used to accurately position the patterning device MA with respect to the path of the beam B and substrate W. In general, movement of the support structure MT and the substrate table WT will be realized with the aid of a long-stroke module for coarse poisoning and a short-stroke module for fine positioning. However, in the case of a stepper (as opposed to a scanner) the support structure may be connected to a short stroke actuator only or may be fixed.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed A known problem with conventional apparatus is the problem of apodization as the beam passes through the projection system PL. Apodization is a known optical phenomenon where the angular intensity distribution of a light beam is non-uniform and in particular where the intensity falls away at the edges of the beam. Lens apodization is becoming an increasing problem particularly for example in systems that use a complementary phase shaft mask. Such a mask is typically illuminated by a coherent light beam with the light being concentrated around the optical axis of the system. The diffracted light will not contain a zero order beam and will be more directed towards the edge of the aperture of the system. The separation between these diffracted beams (and thus the distance to the optical axis) is proportional to the resolution of the feature being imaged. Apodization can lead to an equivalent dose error dependent on the resolution of the lines being imaged. It is important therefore to be able to measure lens apodization and differences in lens apodization both in one apparatus where there may be drift over time and between systems.

In order to measure apodization accurately it is necessary to know the light distribution at the reticle level in order to compare this with the light distribution at the wafer level. Currently in known apodization determination techniques the light distribution at the reticle level is assumed (for example to have a uniform distribution) but this is not necessarily the case. One solution to this may be to directly measure the light distribution at the reticle level but this may not be possible or easy. The present invention at least in some embodiments presents an alternative solution in which multiple shifted copies of the same light distribution (whatever it happens to be) are measured with different parts of the lens.

FIG. 2 shows schematically the basic idea behind an embodiment of the present invention. FIG. 2 illustrates the pupil 1 of the illumination system IL and the pupil 2 of the projection lens PL. A pinhole reticle 3 is placed between the pupil 1 of the illumination system IL and the pupil 2 of the projection system with the pinhole reticle 3 being generally located in the focal plane of the illumination system IL. In other words the pinhole reticle is located in the plane where in use the mask MA would be located. The pinhole reticle 3 will be described in more detail below. Below the projection system PL is provided sensing means comprising a sensor module including a camera having camera pupil 4. The camera pupil 4 is located in generally the same plane as the substrate W would be located in use. The camera may be placed in a far field plane without imaging optics or may be located in a pupil plane with imaging optics.

FIG. 3 shows in more detail the structure of the pinhole reticle 3. The reticle 3 comprises an array of optical wedges 5 disposed in a regular array in the X and Y directions. As shown in FIG. 3 the array comprises seven wedges in the X direction and 4 wedges in the Y direction. The number of wedges in the X direction can be chosen at will, but the number of wedges in the Y direction is important as will be explained further below. Each wedge 5 is disposed on a reticle substrate 6 and a pinhole is located beneath each wedge.

FIGS. 4(a)-(c) illustrates the shape of the wedges 5. The wedges are provided on a reticle substrate 6 and each wedge has a top surface angled relative to the surface of the substrate 6. The angle of the top surface may be chosen as desired and generally will be a compromise between a smaller angle leading to higher resolution and a larger angle that will give a better signal to noise ratio. The purpose of the wedges 5 is to shift the light cone. As can be seen from FIGS. 4(a)-(c) compared with FIG. 4(a) which is provided purely for illustration and shows the condition where no wedge is provided, the wedges in FIGS. 4(b) and (c) shift the light cone to the right and to the left respectively where the wedges 5 in the FIGS. 4(b) and 4(c) are mirror images of each other. In one example, there are four relative orientations for the wedges located respectively at angles that are ±45° and ±135° relative to the X and Y axes. These four different azimuthal positions for the wedges are illustrated schematically in FIG. 3 by the orientations of the triangles that indicate the wedges 5.

The use of the apparatus described above to determine apodization will now be described. Referring back to FIG. 4 it is important to note that the presence of the wedges 5 tilts the light cone in the field plane. This is equivalent to a shift in the pupil plane In use, the pinhole reticle 3 is positioned in the object plane such that light from the illumination pupil passes through a pinhole associated with a wedge 5. Depending on the orientation of the wedge 5 the light cone will be shifted so that it takes a different path through the projection system PL.

By shifting the pinhole reticle 3 in the Y direction the light passes through four successive pinholes each provided with a wedge with a different orientation, the light takes four different paths through the projection system PS before being image by the sensor module incorporating the camera. The intensity of the light received at the sensor module from each of the four pinhole/wedge pairs is measured and since in each the light originates from the same point in the illumination pupil any differences in light intensity can only be the result of the projection system PL and such differences represent the apodization difference of two neighbouring parts of the projection system PL.

In the above example the light passes through each pinhole/wedge pair of a set of four (in the Y direction) in turn before moving on to the next set of four pairs. Alternatively, light may pass successively through each pinhole/wedge pair in the first row of seven such pairs, and then the reticle is moved in the Y direction and the pinhole/wedge pairs in the second row are illuminated, and then this is repeated for the third and fourth rows. The sequence of illumination of the pinhole/wedge pairs is however not critical. Indeed it may be possible to illuminate all seven pinhole/wedge pairs in one row simultaneously before moving the reticle in the Y direction to illuminate the next row.

It will be understood that the number of pinhole/wedge pairs in the X direction can be chosen as desired. In the embodiment of FIG. 3 there are seven sets of four pinhole/wedge pairs in the X-direction which may, for example, have a pitch spacing of 4.24 mm, but other arrangements are possible including for example fourteen sets of four pinhole/wedge pairs having a spacing of 2.12 mm. The number of pinhole/wedge pairs in the Y direction is, however, circumscribed. To shift the light cone in two directions would require a minimum of two wedges plus a reference. The reference need not take the form of a wedge but it is desirable that it does as otherwise there will be different light losses owing to the absence of the wedge (which will have some reflection losses). Accordingly, three optical paths through the projection lens are created; a first optical path is created by the first wedge, a second optical path is created by the second wedge and a third optical path is created by the third wedge, which acts as a reference. As indicated above, the reference optical path is not necessarily created using a wedge but could also be created using a pin hole only. Light intensities are measured of light passing through the first, second and third optical path. With the three measurements, two derivatives can be calculated by determining a first difference in measured intensity between the first and the second measurement and a second difference in measured intensity between the first and the third measurement. Since the angles of the wedges are known, the spatial separation of the optical paths in the pupil plane is known. From the measured intensities and spatial separation a two-dimensional apodization map can be calculated. Four wedges are convenient from the point of view of symmetry in the XY plane but as explained above, the present invention could also be implemented by three wedges. In the embodiment shown there are four wedge/pinhole pairs in the Y direction with respective wedges orientated by 90° relative to each other to provide maximum symmetry.

In one example, all of the pinholes are covered by a wedge, but it may be possible to leave one pinhole in each Y direction row uncovered to act as a reference. This is less desirable, however, as it requires the loss due to a wedge as a function of angle to be taken into account.

FIG. 5 illustrates in general the manner in which the light paths through the projection system are shifted by using wedges in conjunction with a pinhole reticle comprising an array of pinhole/wedge pairs arrayed in the X and Y directions with for a fixed location in the X direction the orientation of the wedges being different in each pinhole/wedge pair in the Y direction. It will be understood that as all light passes through a wedge any apodization effects of the wedges will be constant and can thus be disregarded when intensity differences are being calculated.

FIG. 5 also illustrates a part of a calibration procedure. It is important to know the tilt induced by the wedge at object level. This can be measured by using a source of coherent illumination where all light is concentrated about the optical axis. A small circle will be measured at the optical axis of the camera and then on introducing a pinhole/wedge pair this small circle will be shifted. The amount that the circle is shifted will be a measure of the tilt of the wedge. This procedure can be repeated for all pinhole/wedge pairs.

It will also be understood that by using The method according to an embodiment of the present invention it is not necessary to know the light distribution in the illumination pupil as light from the same point in the illumination field is directed along different paths through the projection system so that any intensity differences detected by the sensor module are caused only by the projection system.

As an alternative to using optical wedges it may also be possible to use blazed diffraction gratings that are optimised for use at a specific wavelength.

The measurements obtained by the sensor module of light intensity at adjacent points contain data relating to the apodization difference of two neighbouring parts of the projection system pupil and may be passed to digital processing means which then reconstructs the total apodization map. This may be done using techniques that are identical to the algorithms used in shearing interferometry where a wavefront difference is measured between displaced copies of the wavefront. From these copies the original wavefront can be reconstructed. See for instance "Optical Shop Testing" (Second Edition) by Daniel Malacara, John Wiley & Sons (1992), which is incorporated by reference herein in its entirety. It will be understood that data from the sensor module will be sent to processing means which may include computer processing means running software implementing the necessary algorithms.

It will be appreciated that aspects of the present invention can be implemented in any convenient way including by way of suitable hardware and/or software. For example, a device arranged to implement the present invention may be created using appropriate hardware components. Alternatively, a programmable device may be programmed to implement embodiments of the present invention. The present invention therefore also provides suitable computer programs for implementing aspects of the present invention. Such computer programs can be carried on suitable carrier media including tangible carrier media (e.g., hard disks, CD ROMs and so on) and intangible carrier media such as communications signals.

While specific embodiments of the present invention have been described above, it will be appreciated that the present invention may be practiced otherwise than as described. The description is not intended to limit the present invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of determining apodization properties of an optical system comprising an illumination system and a projection system, the method comprising:
   allowing light from a given point in an illumination field to pass through the projection system along at least a first optical path, a second optical path and a third optical path;
   determining a first difference in intensity of light received in a projection field from the first optical path and the second optical path;
   determining a second difference in intensity of light received in the projection field from the first optical path and the third optical path; and
   calculating apodization properties of the projection system from the first difference in intensity of light and the second difference in intensity of light.

2. The method of claim 1, wherein light is allowed to pass through the projection system from a plurality of points disposed in a first direction perpendicular to the optical axis of the system.

3. The method of claim 1, wherein the at least first optical path, second optical path and third optical path are created by interposing optical elements between the illumination system and the projection system.

4. The method of claim 3, wherein the optical elements comprise optical wedges with different orientations.

5. The method of claim 3, wherein the optical elements comprise blazed gratings.

6. The method of claim 1, comprising:
   interposing between the illumination system and the projection system a substrate comprising an array of pinholes, at least some of the pinholes being covered by an optical wedge and forming a wedge/pinhole pair; and
   successively illuminating the wedge/pinhole pairs.

7. The method of claim 6, wherein the array comprises a first number of pairs in a first direction and a second number of pairs in a second direction, wherein in a row of pairs in the second direction the orientation of the wedge differs in each pair.

8. The method of claim 7, wherein in the array a row of pairs in the second direction comprises four pinhole/wedge pairs.

9. The method of claim 8, wherein in a row of pairs in the second direction the wedges are orientated at 90° intervals relative to each other.

10. The method of claim 1, wherein the optical system is part of a lithographic apparatus.

11. An apparatus for determining apodization properties of an optical system comprising an illumination system and a projection system, the apparatus comprising:
   an optical source configured to generate a beam of radiation to pass through the optical system;
   a substrate disposed in an illumination field and configured to pass light through the projection system along at least a first optical path, a second optical path and a third optical path;
   a sensing module configured to detect the light received in a projection; and
   a computing device configured to:
   determine a first difference in intensity of light received in a projection field from the first optical path and the second optical path,
   determine a second difference in intensity of light received in the projection field from the first optical path and the third optical path, and
   calculate apodization properties of the projection system from the first difference in intensity of light and the second difference in intensity of light.

12. The apparatus of claim 11, wherein the substrate further comprises an optical element provided between the illumination system and the projection system.

13. The apparatus of claim 12, wherein the optical element comprises optical wedges.

14. The apparatus of claim 12, wherein the optical element comprises blazed gratings.

15. The apparatus of claim 12, wherein the substrate comprises an array of pinholes with each pinhole having an associated optical wedge forming a pinhole/wedge pair.

16. The apparatus of claim 15, wherein the array comprises a first number of the pairs in a first direction and a second number of pairs in a second direction, wherein in a row of pairs in the second direction the orientation of the wedge differs in each pair.

17. The apparatus of claim 16, wherein in the array a row of pairs in the second direction comprises four pinhole/wedge pairs.

18. The apparatus of claim 17, wherein in a row of pairs in the second direction the wedges are orientated at 90° intervals relative to each other.

19. The apparatus of claim 11, wherein the sensing module includes a camera.

20. The apparatus of claim 11, wherein the optical system is part of a lithographic apparatus.

21. The apparatus of claim 11, wherein the substrate is further configured to shift along a plane parallel with the substrate such that shifting of the substrate causes the light to pass through a given pinhole of a plurality of pinholes in the substrate to form either the first optical path, the second optical path or the third optical path.

22. The method of claim 1, further comprising shifting a substrate along a plane parallel with the substrate such that shifting of the substrate causes the light to pass through a given pinhole of a plurality of pinholes in the substrate to form either the first optical path, the second optical path or the third optical path.

* * * * *

UNITED STATES PATENT AND TRADEMARK OFFICE
CERTIFICATE OF CORRECTION

PATENT NO. : 9,261,402 B2
APPLICATION NO. : 13/849333
DATED : February 16, 2016
INVENTOR(S) : Johannes Jacobus Matheus Baselmans Page 1 of 1

It is certified that error appears in the above-identified patent and that said Letters Patent is hereby corrected as shown below:

In the claims

In column 12, line 19, claim 11, after "projection" please insert --field--.

Signed and Sealed this
Twenty-eighth Day of June, 2016

Michelle K. Lee
*Director of the United States Patent and Trademark Office*